US008599915B2

(12) United States Patent
Zhao et al.

(10) Patent No.: US 8,599,915 B2
(45) Date of Patent: Dec. 3, 2013

(54) PHASE-SHIFTED PULSE WIDTH MODULATION SIGNAL GENERATION DEVICE AND METHOD THEREFOR

(75) Inventors: Bin Zhao, Irvine, CA (US); Jack W. Cornish, Foothill Ranch, CA (US); Andrew M. Kameya, Irvine, CA (US); Weizhuang W. Xin, Alsio Viejo, CA (US)

(73) Assignee: Freescale Semiconductor, Inc., Austin, TX (US)

( * ) Notice: Subject to any disclaimer, the term of this patent is extended or adjusted under 35 U.S.C. 154(b) by 367 days.

(21) Appl. No.: 13/025,201

(22) Filed: Feb. 11, 2011

(65) Prior Publication Data

US 2012/0207205 A1 Aug. 16, 2012

(51) Int. Cl.
*H03K 7/08* (2006.01)
*H03K 9/08* (2006.01)

(52) U.S. Cl.
USPC ............ 375/238; 370/212; 332/109; 345/204

(58) Field of Classification Search
USPC ............. 375/238; 370/205, 212; 345/213, 82, 345/212, 204, 102, 84, 94; 332/109; 327/114, 172, 175
See application file for complete search history.

(56) References Cited

U.S. PATENT DOCUMENTS 4,162,444 A 7/1979 Rogers
4,615,029 A 9/1986 Hu et al.
4,649,432 A 3/1987 Watanabe et al.
4,686,640 A 8/1987 Simison
4,907,862 A 3/1990 Suntola
5,025,176 A 6/1991 Takeno
5,038,055 A 8/1991 Kinoshita
5,508,909 A 4/1996 Maxwell et al.
5,668,611 A 9/1997 Ernstoff et al.
5,723,950 A 3/1998 Wei et al.
5,844,540 A 12/1998 Terasaki
5,898,329 A 4/1999 Hopkins
6,281,822 B1 8/2001 Park
6,369,782 B2 4/2002 Shigeta
6,864,641 B2 3/2005 Dygert
6,937,084 B2 8/2005 Bowling (Continued)

FOREIGN PATENT DOCUMENTS

WO 2008124718 A2 10/2008

OTHER PUBLICATIONS

Feng et al., "A New Switched-Capacitor Frequency Modulated Driver for Light Emitting Diodes," Review of Scientific Instruments 78, 114710, American Institute of Physics, 2007, 4 pages.

(Continued)

*Primary Examiner* — Jean B Corrielus

(57) ABSTRACT

First information is received at a first pulse width modulation (PWM) module responsive to a chip select signal being asserted at a chip select input of a communication bus of the first PWM module during a first time. The first information is latched at a control register of the first PWM module in response to a first logic transition of the chip select signal. A first PWM signal is provided at a first output of the first PWM module beginning a predetermined amount of time after the first logic transition of the chip select signal, the first PWM signal generated by the first PWM module based upon the first information.

20 Claims, 8 Drawing Sheets

(56) References Cited

U.S. PATENT DOCUMENTS

| | | | | |
|---|---|---|---|---|
| 6,943,500 | B2 | 9/2005 | LeChevalier | |
| 6,995,592 | B2 | 2/2006 | Agarwal | |
| 7,106,294 | B2 | 9/2006 | Kumamoto et al. | |
| 7,126,397 | B1 | 10/2006 | Mok | |
| 7,176,948 | B2 | 2/2007 | Lewis | |
| 7,262,724 | B2 | 8/2007 | Hughes et al. | |
| 7,391,280 | B2 | 6/2008 | Hsu | |
| 7,436,378 | B2 | 10/2008 | Ito et al. | |
| 7,511,545 | B1 | 3/2009 | Kesler | |
| 7,550,932 | B2 | 6/2009 | Kung et al. | |
| 7,593,243 | B2 | 9/2009 | Ganev et al. | |
| 7,741,885 | B1 | 6/2010 | Guo et al. | |
| 7,800,415 | B2 | 9/2010 | Yedevelly et al. | |
| 7,825,610 | B2 | 11/2010 | Zhao et al. | |
| 7,843,242 | B1 | 11/2010 | Zhao et al. | |
| 8,358,264 | B2 | 1/2013 | Nose et al. | |
| 2003/0160804 | A1* | 8/2003 | Willis et al. | 345/694 |
| 2003/0201986 | A1* | 10/2003 | Willis et al. | 345/204 |
| 2004/0008159 | A1 | 1/2004 | Cunha et al. | |
| 2004/0208011 | A1 | 10/2004 | Horiuchi et al. | |
| 2004/0232964 | A1 | 11/2004 | Wiktor et al. | |
| 2004/0233144 | A1 | 11/2004 | Rader et al. | |
| 2004/0251942 | A1 | 12/2004 | Chiu et al. | |
| 2005/0275355 | A1 | 12/2005 | Samuelsson | |
| 2006/0064609 | A1 | 3/2006 | Bryan | |
| 2006/0164142 | A1 | 7/2006 | Stanley | |
| 2006/0186830 | A1 | 8/2006 | Shami et al. | |
| 2007/0047272 | A1 | 3/2007 | Kris | |
| 2007/0080911 | A1 | 4/2007 | Liu et al. | |
| 2007/0182701 | A1 | 8/2007 | Kim et al. | |
| 2007/0253330 | A1 | 11/2007 | Tochio et al. | |
| 2008/0054815 | A1 | 3/2008 | Kotikalapoodi | |
| 2008/0074381 | A1 | 3/2008 | Kumamoto | |
| 2008/0297067 | A1 | 12/2008 | Wang et al. | |
| 2009/0073735 | A1 | 3/2009 | Kesler | |
| 2009/0128045 | A1 | 5/2009 | Szczeszynski et al. | |
| 2009/0187925 | A1 | 7/2009 | Hu et al. | |
| 2009/0230874 | A1 | 9/2009 | Zhao et al. | |
| 2009/0230891 | A1 | 9/2009 | Zhao et al. | |
| 2009/0273288 | A1 | 11/2009 | Zhao et al. | |
| 2009/0315481 | A1 | 12/2009 | Zhao | |
| 2010/0026203 | A1 | 2/2010 | Zhao et al. | |
| 2010/0085295 | A1 | 4/2010 | Zhao et al. | |
| 2010/0134040 | A1 | 6/2010 | Elder | |
| 2011/0169679 | A1* | 7/2011 | Teramoto et al. | 341/144 |

OTHER PUBLICATIONS

Tadakuma, S. et al., "Improved PWM Control for GTO Inverters with Pulse No. Modulation," IEEE Transactions on Industry Applications, vol. 32, No. 3. 1 Jun. 1996, 7 pages.

Non-final Office Action mailed May 9, 2012 for U.S. Appl. No. 12/244,796, 36 pages.

Notice of Allowance mailed Jan. 25, 2012 for U.S. Appl. No. 12/537,443, 18 pages.

Notice of Allowance mailed Mar. 22, 2012 for U.S. Appl. No. 12/625,818, 25 pages.

Non-Final Office Action mailed Oct. 20, 2011 for U.S. Appl. No. 12/537,443, 22 pages.

Takahashi, Akira, Electronic Products: "Methods and features of LED drivers," Mar. 2008, 3 pages.

International Application No. PCT/US2009/035284, Search Report mailed Oct. 28, 2009, 4 pages.

Chung, Luke Huyong, Electronic Products: "Driver ICs for LED BLUs," May 1, 2008, 3 pages.

McNerney, Tim, "Constant-current power supply for Luxeon 5W LED with low-voltage warning and shut-off Software Documentation, as shipped to Mali in first 45 prototypes," Nov. 2004, <www.designthatmatters.org/ke/pubs/kled-doc.txt>, 5 pages.

Texas Instruments Publication, "Interleaved Dual PWM Controller with Programmable Max Duty Cycle," SLUS544A, (UCC28220, UCC28221) Sep. 2003, pp. 1-28.

Maxim: "Application Note 810, Understanding Flash ADCs," Oct. 2, 2001, 8 pages.

National Semiconductor Data Sheet: "LM3432/LM3432B 6-Channel Current Regulator for LED Backlight Application," May 22, 2008, pp. 1-18.

U.S. Appl. No. 12/367,672, filed Feb. 9, 2009, entitled "Serial Configuration for Dynamic Power Control in LED Displays".

U.S. Appl. No. 12/424,326, filed Apr. 15, 2009, entitled "Peak Detection With Digital Conversion".

U.S. Appl. No. 12/504,841, filed Jul. 17, 2009, entitled "Analog-To-Digital Converter With Non-Uniform Accuracy".

U.S. Appl. No. 12/690,972, filed Jan. 21, 2010, entitled "Serial Cascade of Minimium Tail Voltages of Subsets of LED Strings for Dynamic Power Control in LED Displays".

U.S. Appl. No. 12/537,443, filed Aug. 7, 2009, entitled "Pulse Width Modulation Frequency Conversion".

U.S. Appl. No. 12/625,818, filed Nov. 25, 2009, entitled "Synchronized Phase-Shifted Pulse Width Modulation Signal Generation".

U.S. Appl. No. 12/703,239, filed Feb. 10, 2010, entitled "Pulse Width Modulation With Effective High Duty Resolution".

U.S. Appl. No. 12/703,249, filed Feb. 10, 2010, entitled "Duty Transition Control in Pulse Width Modulation Signaling".

U.S. Appl. No. 12/340,985, filed Dec. 22, 2008, entitled "LED Driver With Feedback Calibration".

U.S. Appl. No. 12/363,607, filed Jan. 30, 2009, entitled "LED Driver With Dynamic Headroom Control".

Notice of Allowance mailed Oct. 5, 2010 for U.S. Appl. No. 12/537,692, 13 pages.

PCT Search Report mailed Mar. 28, 2011 for International Application No. PCT/US2010/044067, 3 pages.

Notice of Allowance mailed Dec. 29, 2011 for U.S. Appl. No. 12/703,249, 24 pages.

Non-Final Office Action mailed Aug. 19, 2013 for U.S. Appl. No. 12/703,239, 42 pages.

* cited by examiner

300

PHASE-SHIFTED PULSE WIDTH MODULATION SIGNAL GENERATION DEVICE AND METHOD THEREFOR

FIELD OF THE DISCLOSURE

The present disclosure relates generally to pulse width modulation (PWM) modules and more particularly to the control of PWM signals.

BACKGROUND

Pulse width modulation (PWM) signals often are used for precise control of electronic devices, such as electric motors, light emitting diode (LED) backlights, and the like. In some systems, an input PWM signal is used to generate multiple PWM signals at parallel channels, and the multiple PWM signals are then used to drive one or more respective components. In generating multiple output PWM signals, it often is advantageous to synchronize the output PWM signals with a timing signal or with the input PWM signal itself. To illustrate, in display systems implementing LEDs controlled by the output PWM signals, the input PWM signal often can be synchronized with a frame synchronization signal (the timing signal) received at a PWM module that is based upon the display frame frequency. A lack of synchronization between the PWM signals and a frame signal can result in visual noise due to beating between the display frame frequency, the output PWM frequency, and their harmonics. While the existing techniques for generating multiple PWM signals attempt to reduce signal irregularities based upon certain underlying causes, they do not address other underlying causes of such artifacts.

BRIEF DESCRIPTION OF THE DRAWINGS

The present disclosure may be better understood, and its numerous features and advantages made apparent to those skilled in the art by referencing the accompanying drawings. The use of the same reference symbols in different drawings indicates similar or identical items.

DETAILED DESCRIPTION

Figure 1:
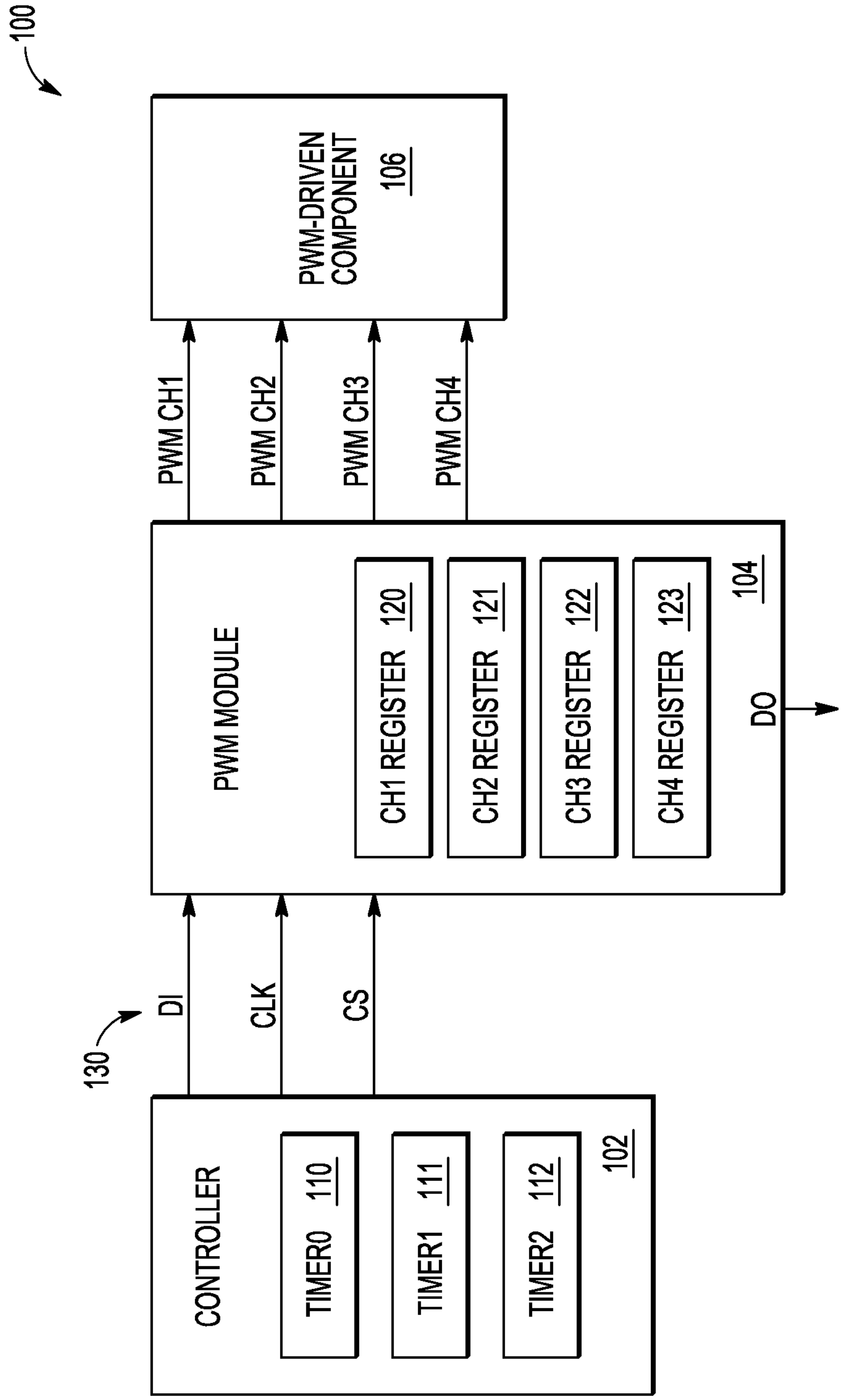
FIG. 1 is a diagram illustrating a pulse width modulation (PWM) signal generator in accordance with at least one embodiment of the present disclosure.

FIGS. 1-8 illustrate aspects of a pulse width modulation (PWM) signal generator for generating multiple PWM signals at parallel PWM channels based on timing information provided by a controller, and in particular, based on digital information provided to a PWM module for storage while a chip select signal is asserted, and based on the timing of a transition of the chip select signal that enables digital information to be stored at the PWM module and a PWM signal to be generated based upon the stored digital information. The timing information provided by the controller can specify a desired duty ratio of each PWM signal, a timing relationship between each PWM signal, how the duty ratio of each PWM signal varies over time, and other desired signal characteristics. For example, a controller can provide timing information to a PWM display generator over a digital interface, such as a Serial Peripheral Interface (SPI), that implements a synchronous serial data link. The digital interface can provide signals implementing one or more clock signals, one or more data signals, and one or more chip select signals. The timing information provide over the digital interface can include digital information provided by a data signal that can be stored at the PWM signal generator in response to transitions of a clock signal while the chip select signal is asserted. The PWM signal generator can initiate generation of each of the plurality of PWM signals in response to when transitions of the chip select signal occur at the digital interface, wherein specific characteristics of the PWM signal, such as a duty ratio, are based on the stored timing information.

The operation of a PWM signal generator disclosed herein is described in the context of a video display device. The brightness of light emitting diodes (LEDs) that provide backlighting at a liquid crystal display (LCD) device can be controlled by altering the duty ratio of PWM signals that supply power to the LEDs. A PWM signal generator can provide a plurality of PWM signals, each of which is used to control the brightness of LEDs at one of a corresponding number of portions of the display device. Timing characteristics of the PWM signals can be controlled based on a video image that is being displayed, and based on other criteria. For example, the duty ratio of the PWM signals can be changed to control the amount of light, and therefore the brightness, provided by the LEDs. In addition, the timing characteristics between PWM signals can be controlled. For example, the timing between the PWM signals, referred to herein as the inter-PWM delay, can be controlled to accommodate the capabilities of a power supply that supplies power to the LEDs. In many devices, one common power supply is used for multiple components, each of which uses one of the PWM signals. Simultaneously changing the duty ratio of two or more PWM signals can place an excessive load on the power supply, which may adversely affect operation of the device. Excessive loading of the power supply can also result when the duty ratio of two or more signals are changed in close succession, such as a sufficiently small fraction of a PWM cycle period. For example, changing the duty ratio of the PWM signals simultaneously or in quick succession can cause a change in loading at a power supply that leads to an undesired error in brightness control at the LEDs. To accommodate, a PWM signal generator can delay altering the duty ratio of one or more PWM signals for a reasonable duration of time after changing the duty ratio of another PWM signal, thereby giving the power supply additional time to recover sufficiently from a load change. The inter-PWM signal delay introduced by the PWM signal generator can be controlled by the timing of the chip select signal used to write data at a PWM module.

A PWM signal typically includes a plurality of PWM cycles, each with two signal transitions, which when viewed over time implement a sequence of pulses. The PWM signal has a characteristic frequency determined by the number of pulses (cycles) provided per unit time. For example, a PWM signal can provide pulses at a frequency of 100 Hz, 25 KHz, or at another desired frequency. Each cycle of a PWM signal includes an active segment, a pulse, and an inactive segment. As used herein with respect to a PWM signal, the term "active segment" refers to that portion of a PWM signal that is at a logic high state. The term "inactive segment" refers to that portion of a PWM signal that is at a logic low state. Each cycle of a PWM signal is further characterized by a duty ratio (also known as a duty cycle), which specifies a ratio between a duration of the active segment and the total duration of the active segment plus the inactive segment. For example, a PWM signal having a frequency of one Hertz (a cycle having a duration of one second) and a duty ratio of twenty-five percent, includes an active segment with a duration of 0.25 seconds and an inactive segment with a duration of 0.75 seconds. The duty ratio of a PWM signal can be maintained for a given duration, in which case the PWM signal includes a steady stream of substantially identical pulses. Alternatively, the duty ratio of the PWM signal can be altered, the frequency changed, or a combination thereof. The duty ratio of a PWM signal can vary from substantially zero percent to substantially 100 percent, and has the effect of varying the average power provided by each cycle of the PWM signal. For example, a PWM signal can be used to vary the speed of a motor or the brightness of a light source by varying the duty ratio of the PWM signal and thereby varying the average amount of power supplied to the device.

FIG. 1 illustrates a PWM signal generator 100 driving a PWM-Driven component 106 in accordance with at least one embodiment of the present disclosure. The PWM signal generator 100 includes a controller 102 having a communications bus interface connected to a digital interface 130, and a PWM module 104 having a communications bus interface connected to the digital interface 130. The controller 102 can provide timing information to the PWM module 104 via a digital interface 130, also referred to as a communication bus, to control the timing of each PWM signal of a set of PWM signals generated by the PWM module 104. The PWM module 104 can represent an integrated circuit separate from the controller 102 that includes driver circuitry to drive the set of PWM signals provided to a PWM-driven component 106, for example a motor or a display device. The timing information provided by outputs of the controller 102, and received at inputs of the PWM module 104, specifies various timing information for each individual PWM signal generated by the PWM module 104.

In operation, according to one embodiment, the controller 102 can control the duty ratio of each PWM signal, and can control a duration between when a change in duty ratio occurs between respective PWM signals based upon the timing information. For example, a desired duty ratio of a PWM signal can be digitally encoded by the controller 102 using ten binary bits to provide $2^{10}$ (1024) unique duty ratio values for storage at the PWM module via the data interconnect DI. Thus, a duty ratio of approximately 50% can be associated with a value of 512 (half of 1024). The controller 102 can modify the duty ratio of each PWM signal during operation as described herein. The timing information can also control a duration between when a change in duty ratio occurs between respective PWM signals. The delay in changing the duty ratio between PWM signals is referred to herein as an inter-PWM signal delay. The inter-PWM signal delay can include multiple delay components that are based upon different factors. For example, one portion of the inter-PWM signal delay is referred to herein as the Power Supply Recovery (PSR) delay. A PSR delay is based upon the amount of time a power supply is likely to need to adjust to a change in loading due to a change in PWM duty ratios or PWM cycle duration, and represents a delay implemented between when the duty ratio of one PWM signal of the plurality of PWM signals is changed relative to when the duty ratio of the next PWM signal of the plurality is changed. Another portion of the inter-PWM signal delay between the two PWM signals represents a phase shift between the PWM signals within a single PWM cycle. Specific embodiments of implement the inter-PWM signal delay will be better understood with reference to the disclosure herein.

The controller 102 has a set of outputs that are connected to inputs of the PWM module 104 via the digital interface 130, which includes interconnects to provide signals data-in (DI), clock (CLK), and chip select (CS). While the interconnects associated with digital interface can be implemented in a number of manners, they are assumed to be conductors for purposes of discussion. The PWM module 104 has an output at its communication bus, labeled DO, for forwarding data received via signal DI to an input of another PWM module, if applicable. The PWM module 104 also includes outputs for providing PWM signals PWM CH1, PWM CH2, PWM CH3, and PWM CH4 to the PWM-driven component 106. The controller 102 includes timer modules 110, 111, and 112, labeled TIMER0, TIMER1, and TIMER2, respectively. The PWM module 104 includes channel registers 120, 121, 122, and 123 labeled CH1 REGISTER, CH2 REGISTER, CH3 REGISTER, and CH4 REGISTER, respectively.

The controller 102 can include a processor device, a memory device, other logic components, or a combination thereof. In an embodiment, the controller 120 can be a video display controller. The controller 102 can be configured to provide timing information to the PWM module for use as previously described. For example, duty ratio information is provided to the PWM module 104 via the data-in signal DI by pulsing the clock signal CLK while the chip select signal CS is asserted, e.g., at a low voltage logic level. However, the duty ratio information is not implemented at a particular PWM channel until an appropriate transition, e.g. a temporal event, occurs at the chip select signal CS. For example, transitions of the chip select signal CS are used by the PWM module 104 to initiate a change in a PWM signal, thereby implementing the inter-PWM signal delay introduced between the PWM signals PWM CH1, PWM CH2, PWM CH3, and PWM CH4, as discussed further below.

Digital interface 130 can include a serial peripheral interface (SPI) or it can include another standard or proprietary interface protocol that includes a chip select signal. In the present example illustrated at FIG. 1, the digital interface 130 includes interconnects to provide a data-in signal DI, a clock signal CLK, and a chip select signal CS. The data-in signal DI provides digital data in a serial manner with each corresponding data value coinciding with a respective transition of the clock signal CLK. One skilled in the art will appreciate that another signal having characteristics similar to those disclosed herein can be substituted for the chip select signal CS without departing from the scope of the present disclosure.

The PWM module 104 is illustrated to include channel registers 120-123, and can include additional devices, such as a processor device, a state machine, other logic devices, (not illustrated) or a combination thereof. In operation, timing information received at a data input of the PWM module 104 from the controller 102 that is related to particular duty ratios is stored at the channel registers 120-123. The PWM module 104 is configured to generate the PWM signals PWM CH1, PWM CH2, PWM CH3, and PWM CH4 based on the timing information stored at channel register 120-123. Although FIG. 1 illustrates an example implementation whereby four output PWM signals are generated, the techniques described herein can be used to generate any number of parallel, delayed and/or phase-shifted output PWM signals.

The PWM-driven component 106 can include any device configured to receive a plurality of PWM signals. For example, the PWM-driven component 106 can include a motor, a light source, a switching power supply, a display device such as a computer or video display monitor, or another device. The operation of the PWM signal generator 100 is described in detail with reference to the subsequent figures.

Figure 2:
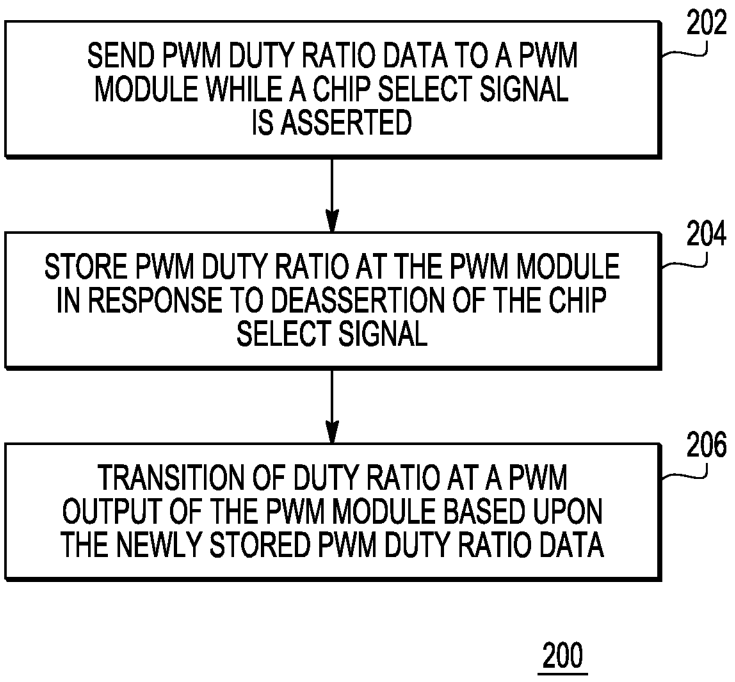
FIG. 2 is a flow diagram illustrating an example method of operation of the PWM signal generator of FIG. 1 in accordance with at least one embodiment of the present disclosure.

FIG. 2 illustrates an example method 200 of operation of the PWM signal generator 100 of FIG. 1 in accordance with at least one embodiment of the present disclosure. At block 202, a controller transmits duty ratio data to a PWM module while a chip select signal is asserted. For example, in response to transitions of the clock signal CLK while the chip select signal CS is asserted, the controller 102 of FIG. 1 can cause PWM timing information at signal DI that is indicative of a desired duty ratio to be received at a data input of the PWM module 104. At block 204, the duty ratio data is latched at a control register of a PWM module in response to a deassertion of the chip select signal. For example, when the chip select signal is deasserted, the PWM duty ratio data is latched at one of the selected channel registers 120-123 to alter a duty ratio of a respective PWM output signal.

The flow proceeds to block 206 where a PWM signal having an altered duty ratio is initiated at an initial PWM cycle by an initial logic transition of the PWM signal that is maintained an amount of time based upon the duty ratio information stored at one of the channel registers 120-123. For example, upon detecting a particular transition of the chip select signal CS, such as the transition that negates the chip select signal CS after writing data to one of the channel registers 120-123, the PWM module 104 will provide a PWM signal, such as PWM CH1, to begin generating a PWM signal based upon the channel register information after a predetermined amount of time, thereby initiating the PWM signal. The predetermined amount of time can be fixed, such as an amount based upon a fixed number of system clock cycles (not shown) needed at the PWM module 104 to implement the change, or programmable, such as based upon a stored delay. In one embodiment, the initial logic transition of the PWM signal within the initial PWM is timed to substantially coincide with the transition of chip select signal CS from an asserted state, e.g., logic low state, to a negated state, e.g., a logic high state after writing to a channel register. For example, according to one embodiment, a PWM signal will be initiated if its corresponding channel register was written to since the last asserted-to-negated signal transition of the chip select signal CS. An amount of time between when the particular transition of the chip select signal CS occurs and when the PWM signal is initiated to implement the change can be inherent to the design of the PWM module 104, and can occur within a few system clock cycles of the PWM module.

Figure 3:
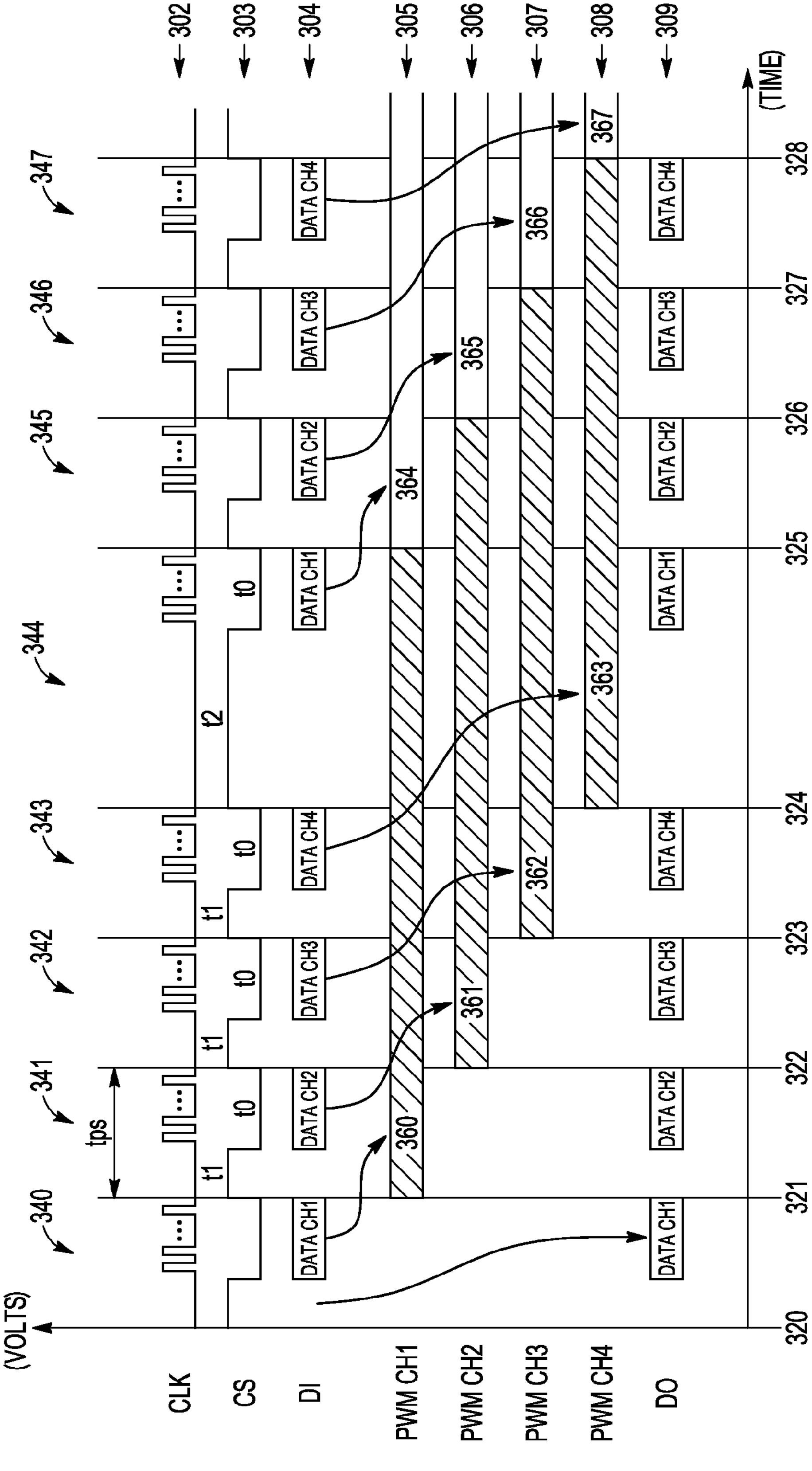
FIG. 3 depicts a timing diagram illustrating the operation of the PWM signal generator of FIG. 1 in accordance with at least one embodiment of the present disclosure.

FIG. 3 depicts a timing diagram 300 illustrating the operation of the PWM signal generator 100 of FIG. 1 in accordance with at least one embodiment of the present disclosure. The timing diagram 300 depicts the controller 102 sending PWM timing information to the PWM module 104 via the SPI interface 130, and the subsequent storage of the PWM data and initiation of the PWM signals PWM CH1, PWM CH2, PWM CH3, and PWM CH4 by the PWM module 104 based on logic transitions of the chip select signal CS. The timing diagram 300 includes a horizontal axis representing time, a vertical axis representing voltage, and includes signal waveforms CLK 302, CS 303, DI 304, PWM CH1 305, PWM CH2 306, PWM CH3 307, PWM CH4 308, and DO 309. Also illustrated at timing diagram 300 are time references 320-328, intervals 340-347, and PWM output intervals 360-367 that indicate when corresponding PWM signal begins transitioning based upon altered information as stored at channel registers 120-123. A PWM output interval can include one or more PWM cycles having a common duty ratio. The number of PWM cycles included during a PWM output interval is based on the period of a PWM cycle and based on the duration of the PWM output interval. For example, the PWM output interval 360 can include a single PWM cycle of the signal PWM_CH1 from time 321 to time 325, or it can include multiple PWM cycles. The PWM module 104 is configured to generate the four individual PWM output signals 305-308 in a parallel manner, wherein the inter-PWM signal delay, the delay between when the PWM signals are initiated, can be controlled as described herein.

The controller 102 can initiate transfer of timing information to each of the channel registers 120-123 at the PWM module 104 by enabling the chip select signal, e.g., transitioning the chip select signal CS to a logic low state. The controller 102 provides timing information to be stored at the PWM module 104 via the data-in signal DI in a serial manner, while transitioning clock signal CLK to indicate that the timing information provided by the signal DI is valid. In one embodiment, the data-in signal DI is provided over an interconnect that provides a single binary bit of information, e.g., one conductor, during each respective cycle of clock signal CLK. One skilled in the art will appreciate that signal DI can also be provided multiple bits at a time over a plurality of conductors, wherein multiple bits of information can be transferred to the PWM module during each cycle of clock signal CLK. The timing information provided by the data-in signal DI can include an address to select a particular channel register of channel registers 120-123, duty ratio information to store at the selected channel register, and other desired information.

For example, the timing diagram 300 illustrates the controller 102 sending and storing duty ratio information at the CH1 register 120 during interval 340. The controller 102 transitions the chip select signal CS to a logic low state and proceeds to provide a channel address in a serial manner via the data-in signal DI. Each bit of the channel address is received at the PWM module 104 in response to a corresponding transition of the clock signal CLK. The channel address information can be followed by duty ratio information in a similar serial manner, which is transferred to CH1 register 120. Alternatively, a channel address can be provided by a counter included at the PWM module 104 (not shown). At time 321, the controller 102 negates the chip select signal CS, e.g., transitions the chip select signal CS to a logic high state, which configures the PWM module 104 to latch the PWM duty ratio data to CH1 register and to initiate the signal PWM CH1, e.g., to begin generating the signal PWM CH1 (indicated by PWM output interval 360) with a duty ratio based on the duty ratio information stored at CH1 register 120. The PWM module 104 continues to generate the signal PWM CH1 with the specified duty ratio until time 325, at which time the duty ratio of the signal PWM CH1 has been changed as a result of the duty ratio information being updated at CH1 register 120. As before, a transition of the chip select signal CS from a logic low state to a logic high state at time 325 configures the PWM module 104 to latch the new PWM duty ratio at the CH1 register 120 and to initiate generation of the signal PWM CH1 with the revised duty ratio, as indicated by the PWM output interval 364. The duty ratio of the signal PWM CH1 can be periodically updated as desired in the manner just described. Latching, as used herein, is intended to mean storing of information at a level sensitive latch, at a flip flop, by means of a capacitor, or at another type of storage element.

PWM output signals PWM CH2, PWM CH3, and PWM CH4 are initiated in the same manner described above with reference to the PWM output signal PWM CH1. For example, the controller 102 can update the contents of the CH2 register 121 during the interval 341, configure the PWM module 104 to latch the PWM duty ratio at the CH2 register 121, and to initiate generation of the signal PWM CH2 at time 322 (indicated by PWM output interval 361) by transitioning the chip select signal CS from a logic low state to a logic high state. Thus, the PWM signals PWM CH1, PWM CH2, PWM CH3, and PWM CH4 can be provided in a parallel manner, while adjustments to the duty ratio of each individual signal can be performed in a sequential manner. For example, the controller 102 causes the PWM module 104 to introduce an inter-PWM signal delay, delay $t_{ps}$ (e.g.; the duration of interval 341), between the initiation of the PWM output interval 360 corresponding to the signal PWM CH1 and the initiation of the PWM output interval 361 corresponding to the signal PWM CH2.

In accordance with the illustrated embodiment, the duration of each interval of intervals 340-347 corresponds to the time between consecutive transitions of the chip select signal from its asserted state to its negated state. The duration and transitioning of the chip select signal CS is determined by the configuration of the timers 110-112. For example, the duration of the chip select signal CS during intervals 341, 342, and 343 is determined by the TIMER0 110 and by the TIMER1 111. In particular, the chip select signal CS remains at a logic high state for a period of time determined by TIMER1 111, and remains at a logic low state for a period of time determined by the TIMER0 110. The duration of the chip select signal CS during interval 344, is determined by the TIMER0 110 and by the TIMER2 112. In particular, the chip select signal CS remains at a logic high state for a period of time determined by TIMER2 112, and remains at a logic low state for a period of time determined by the TIMER0 110. In an embodiment, the TIMER2 112 can be eliminated and the period of time that the chip select signal CS remains at a logic high state during interval 344 can be determined by the TIMER1 111 in a manner similar to that described with reference to intervals 341-343.

The controller 102 can provide timing information to more than one PWM module and thereby control the generation of additional PWM signals. For example, multiple PWM generators can be connected in a daisy chain manner whereby timing information received via the data-in signal DI can be forwarded to subsequent PWM generators via data-out signal DO, as illustrated by the DO port in FIG. 1 and the DO signal 309 at FIG. 3, which will be discussed further with reference to FIG. 5.

Figure 4:
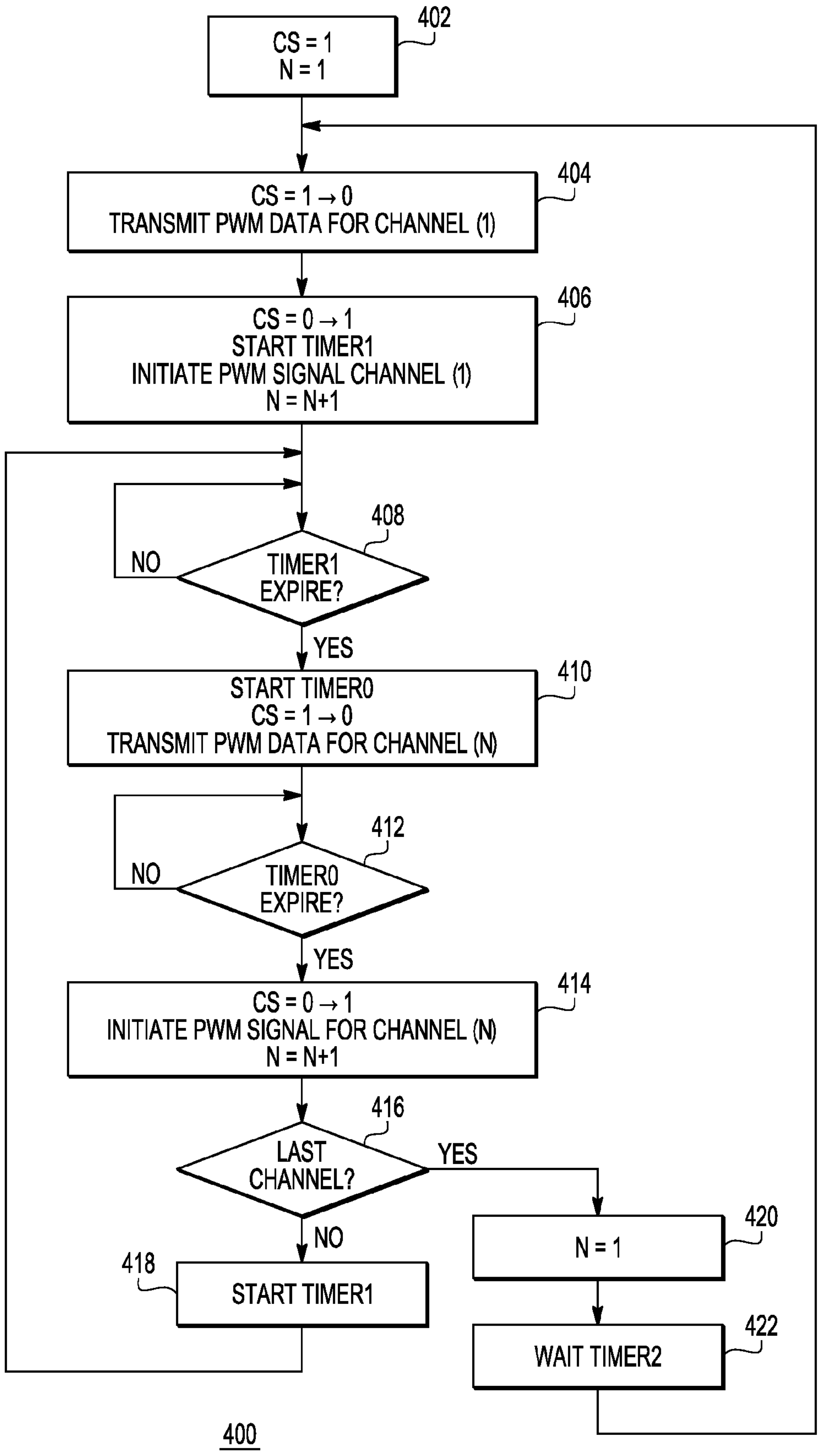
FIG. 4 is a flow diagram illustrating the operation of a PWM signal generator, such as the PWM signal generator of FIG. 1, in accordance with at least one embodiment of the present disclosure.

FIG. 4 is a flow diagram 400 illustrating the operation of a PWM signal generator, such as the PWM signal generator 100 of FIG. 1, in accordance with at least one embodiment of the present disclosure. In particular, the flow diagram 400 can illustrate the operation of the PWM signal generator 100 during intervals 340-344 of FIG. 3. During these intervals, digital information is sequentially sent to each of the channel registers 120-123. The digital information is latched at each of the channel registers and an associated PWM output signal is generated having a duty ratio based on the digital information is initiated in response to when a transition of the chip select signal CS occurs.

Flow diagram 400 starts at block 402 where the chip select signal CS is initially negated, e.g., at a logic high state, and a channel address, N, is set to one to identify a CHANNEL (N). For example, with reference to the timing diagram 300 at FIG. 3, the chip select signal CS is initially at a logic high state at time 320, and the controller 102 determines that channel register 120 is the next PWM channel to be initiated. The flow proceeds to block 404 where the chip select signal CS is asserted, e.g., set to a logic low state, and PWM information corresponding to channel 1, such as a duty ratio, is transmitted. For example, during interval 340, the controller 102 transitions the chip select signal CS to a logic low state and commences transferring data via the data input signal DI and the clock signal CLK. The transmitted data can include the address of the desired channel register (channel register 1 in this case) followed by data indicative of a desired duty ratio to be provided by the PWM signal PWM CH1.

The flow proceeds to block 406 where the chip select signal CS is negated, TIMER1 is started to implement a predetermined duration time $t_1$ (the time during which the chip select signal CS is to remain negated), and the channel address N is incremented. Also at block 406, the PWM module 104 latches the received PWM data into the CH1 register 121 and initiates a PWM output signal at channel 1 (PWM CH1) at a time that corresponds to when the chip select signal CS was negated. For example, the PWM output signal having a duty ratio based upon the stored information will begin a fixed amount of time after the chip select signal CS is negated, where the fixed amount of time can be representative of a delay during which the PWM module 104 detects the transition at the chip select signal CS and implements the duty cycle controlled by the CH1 register 120. For example, at time 321, the controller 102 transitions the chip select signal CS to a logic high state, which indicates to the PWM module 104 that latching of the received PWM data and the generation of signal PWM CH1 should commence (PWM output interval 360). The controller 102 loads the timer TIMER1 111 with an initial value associated with the duration $t_1$, and the TIMER1 111 begins to count down. The flow proceeds to decision block 408 where the flow remains until TIMER1 111 has expired. Once TIMER1 111 has expired, the flow proceeds to block 410.

At block 410 the controller 102 initializes TIMER0 110 to a value corresponding to a desired duration $t_0$ and TIMER0 110 begins to count down. The chip select signal CS is asserted and PWM data corresponding to the next channel, channel 2, is transmitted. For example, during interval 341, TIMER1 111 expires, the controller 102 responds by transitioning the chip select signal CS to a logic low state, and commences to transfer PWM data via the data input signal DI and the clock signal CLK. The transmitted data can optionally include the address of the desired channel register (channel register 2 in this case) followed by data indicative of a desired duty ratio to be provided by the PWM output signal PWM CH2.

The flow proceeds to decision block 412 where the flow remains until TIMER0 110 has expired. Once TIMER0 110 has expired, the flow proceeds to block 414 where the chip select signal CS is transitioned to a logic high state to latch the received PWM data to the related channel register and to initiate generation of a PWM signal corresponding to the next channel, channel N. The channel address is once again incremented. For example, at time 322, the controller 102 transitions the chip select signal CS to a logic high state, which indicates to the PWM module 104 that the latching of the received PWM data to CH2 register and the generation of the signal PWM CH2 should commence (PWM output interval 361). The flow proceeds to decision block 416 where it is determine whether the last PWM channel has been configured and generation of a PWM signal associated with the last channel has been initiated. If additional channels remain to be configured, the flow proceeds to block 418 where timer TIMER1 110 is initialized to once again determine duration $t_1$, and the flow returns to decision block 408 to wait for timer TIMER1 111 to expire.

If, at block 416, the PWM output signal associated with the final channel has been configured and generated, the flow proceeds to block 420 where the channel number (N) is set to one to indicate channel 1 in preparation to start the above procedure anew. The flow proceeds to block 422 where the timer TIMER2 112 is started, as described further below with reference to FIG. 6, and allowed to expire, where upon the flow returns to block 404. For example, at time 324, the PWM module initiates the generation of the PWM output signal PWM CH4 (PWM output interval 363) based on the chip select signal CS transitioning to a logic high state. The controller 102 initializes the timer TIMER2 112 to a value corresponding to the desired duration $t_2$. Once the timer TIMER2 112 has expired during interval 344, the controller 102 asserts chip select signal CS once again and starts to transfer the PWM duty data to the CH1 register 120 with duty ratio information corresponding to the next desired PWM output interval 364.

Figure 5:
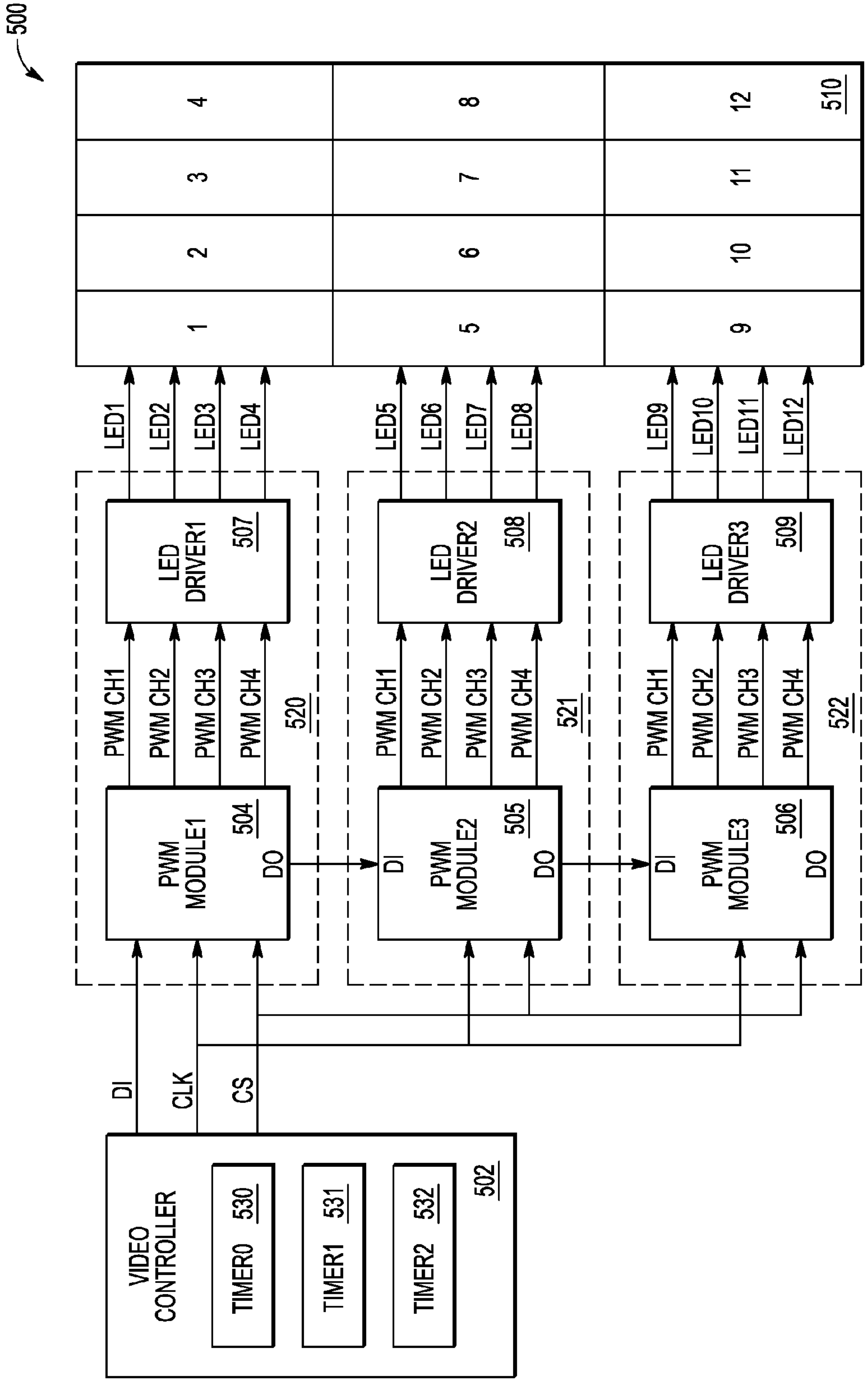
FIG. 5 is a diagram illustrating another PWM signal generator in accordance with at least one embodiment of the present disclosure.

FIG. 5 is a diagram illustrating another PWM signal generator 500 in accordance with at least one embodiment of the present disclosure. The PWM signal generator 500 is similar to the PWM signal generator 100 of FIG. 1 with the exception that three integrated circuit chips, chip1 520, chip2 521, and chip3 522 are interconnected together to provide twelve individual PWM output signals. FIG. 5 illustrates the disclosed PWM signal generator in the context of an exemplary LCD display device, wherein each of the twelve PWM signals is configured to control the brightness of a respective set of backlight LEDs at a corresponding portion of the LCD display device.

The PWM signal generator 500 includes a video controller 502 for providing timing information to chips 520-522 via a digital interface, and is similar in function to the controller 102 of FIG. 1. The video controller 502 includes timers TIMER0-TIMER2 530-532 to control the needed timing sequence as described above, provides a clock signal CLK and a chip select signal CS to integrated circuit chips 520-522, and provides a data-in signal DI to integrated circuit chip 520. Integrated circuit chip 520 forwards the timing information received via data-in signal DI to integrated circuit chip 521 via terminal DO of the PWM MODULE1 504, and integrated circuit chip 521 further forwards the timing information onward to integrated circuit chip 522 (from DO of the PWM MODULE2 505 to DI at the PWM MODULE3 506). For example, assuming 10-bits of data are needed to represent a PWM duty ratio, upon CS assertion, 10-bits of PWM data indicating a desired duty ratio for PWM MODULE3 is serially provided to PWM MODULE1 on DI. Next, 10-bits of PWM data indicating a desired duty ratio for PWM MODULE2 is serially provided to PWM MODULE1 on DI. However, the first 10-bits of information intended for PWM MODULE3, are shifted from DO of PWM MODULE1 to DI of PWM MODULE2, as the second 10-bits of information is being serially shifted into PWM MODULE1. A third 10-bits of information intended for PWM MODULE 1 are subsequently shifted into PWM MODULE1, while the second 10-bits of data are shifted to PWM MODULE2, and the first 10-bits of information are shifted to PWM MODULE3. Upon de-assertion of CS, each set of 10-bits of information are latched at a corresponding control register of PWM MODULE1, PWM MODULE2, and PWM MODULE3. This results in a change of duty ratio at a corresponding output of each of the PWM modules.

Each of integrated circuit chips 520-522 includes a PWM module (PWM MODULE1 504, PWM MODULE2 505, and PWM MODULE3 506) and an LED driver (LED DRIVER1 507, LED DRIVER2 508, and LED DRIVER3 509). Integrated circuit chip 520 includes a PWM module 504 operable to provide four PWM signals (PWM CH1, PWM CH2, PWM CH3, and PWM CH4) to the LED driver 507. The LED driver 507 includes power/current regulation circuitry for providing LED control signals LED 1, LED2, LED3, and LED4 to four corresponding sets of LEDs associated with four corresponding portions of an LED panel 510. For example, the LED control signal LED1 can control back-light LEDs at a first portion of the LED panel 510 (such as the portion labeled "1" at the LED panel 510), the LED control signal LED2 can control a second portion, labeled "2," and so forth. Integrated circuit chip 521 and integrated circuit chip 522 are configured similarly to integrated circuit chip 520, wherein each chip can provide four additional LED control signals, labeled LED5-LED12, and associated with portions 5-12 of the LED panel 510, respectively. During operation of the PWM signal generator 500, the video controller 502 can adjust the duty ratio of each PWM signals PWM CH1-PWM CH4 in chip 520, chip 521 and chip 522, respectively, and thereby control the brightness of each corresponding set of backlight LEDs and thus control the brightness of a corresponding image that is being displayed. Furthermore, as described above, the video controller 502 can control the time that each of the twelve PWM output signals is initiated by controlling the timing of transitions of the chip select signal CS. In accordance with one embodiment of the present disclosure, each of the PWM channels PMM CH1 through PWM CH4 in chip 520, chip 521 and chip 522, respectively, is associated with a different channel register and therefore can be controlled separately from each other PWM channel. Alternatively, only the PWM channels of a specific integrated circuit chip are associated with different channel registers, wherein channel 1 for each chip is accessed by a common channel register address, channel 2 for each chip is accessed by a common channel register address, and so on. The operation of the PWM signal generator 500 is described in detail with reference to timing diagram 600 at FIG. 6 and with reference to timing diagram 700 at FIG. 7.

Figure 6:
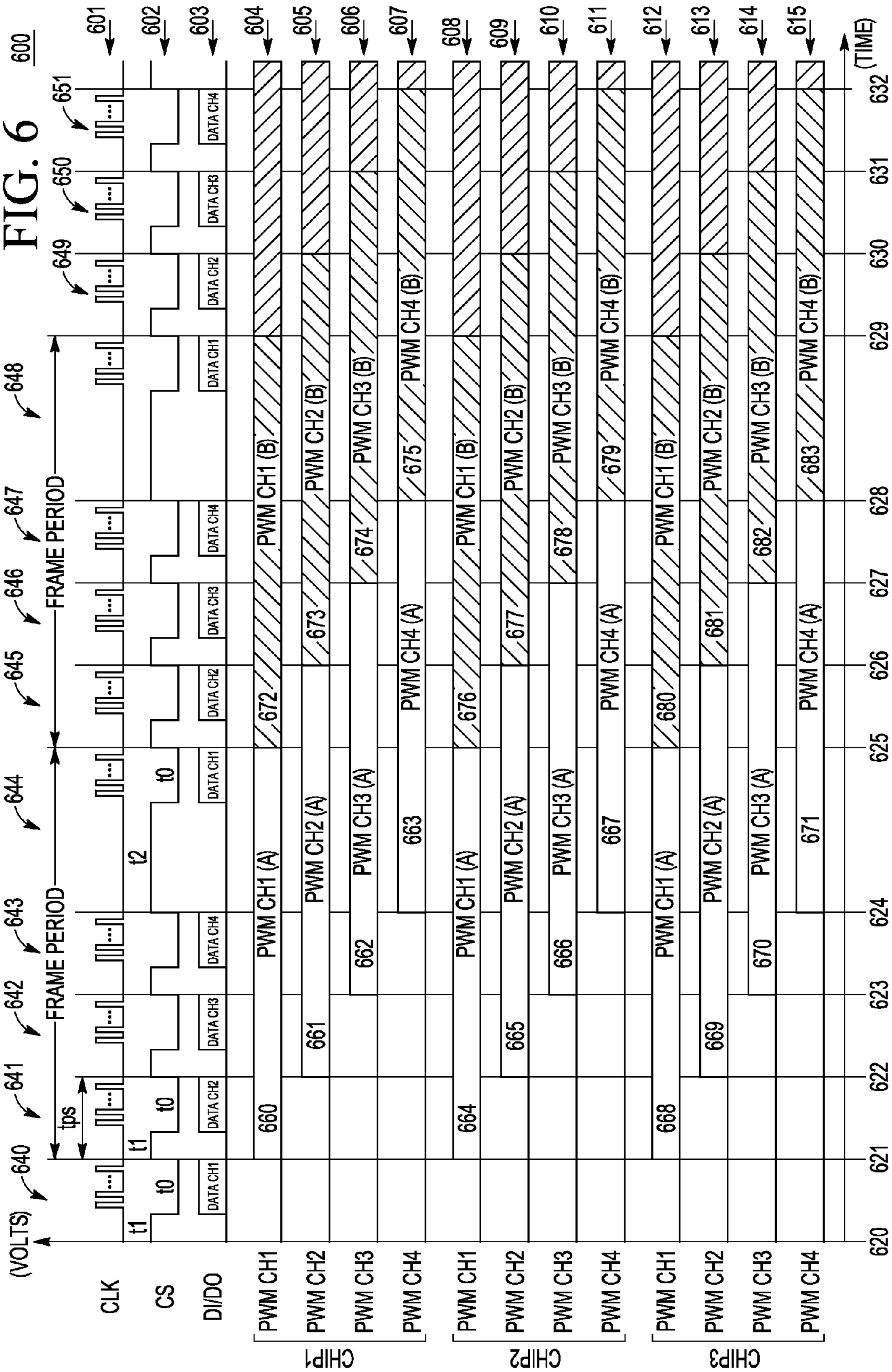
FIG. 6 depicts a timing diagram illustrating the operation of the PWM signal generator of FIG. 5 in accordance with at least one embodiment of the present disclosure.

FIG. 6 depicts a timing diagram 600 illustrating the operation of the PWM signal generator 500 of FIG. 5 in accordance with at least one embodiment of the present disclosure. The timing diagram 600 depicts the video controller 502 sending and storing timing information at the PWM modules 504, 505, and 506 via an SPI interface, and the subsequent generation of the PWM signals PWM CH1, PWM CH2, PWM CH3, and PWM CH4 by each of the integrated circuit chips 520, 521, and 522, respectively, based on the timing information and based on logic transitions of the chip select signal CS. The timing diagram 600 includes a horizontal axis representing time, a vertical axis representing voltage, and includes signal waveforms CLK 601, CS 602, DI/DO 603, PWM CH1 604, PWM CH2 605, PWM CH3 606, and PWM CH4 607 corresponding to integrated circuit chip 520, PWM CH1 608, PWM CH2 609, PWM CH3 610, and PWM CH4 611 corresponding to the integrated circuit chip 521, and PWM CH1 612, PWM CH2 613, PWM CH3 614, and PWM CH4 615 corresponding to the integrated circuit chip 522.

Also illustrated at the timing diagram 600 are time references 620-632, intervals 640-651, and PWM output intervals 660-683. Each PWM module of the PWM modules 504-506 is configured to generate four individual PWM signals in a parallel manner, wherein a change of the duty ratio of one PWM signal of a set of four PWM signals is delayed relative to a change of the duty ratio of another PWM signal of the set of four PWM signals. Thus, the three integrated circuit chips 520-522 can together generate 12 individual PWM signals in a parallel manner, illustrated by waveforms 604-615. The operation of each of the integrated circuit chips 520-522 is similar to the operation of the 104 of FIG. 1 illustrated at the timing diagram 300 at FIG. 3. For example, the PWM module 504 introduces a delay of $t_{ps}$ (the duration of interval 641) between the initiation of the PWM output interval 660 corresponding to the signal PWM CH1 604 and the initiation of the PWM output interval 661 corresponding to the signal PWM CH1 605.

Each of the PWM signals generated by the PWM signal generator 500 is configured to control the intensity of a corresponding set of LEDs at an LCD display device. Accordingly, the timing of the generated PWM signals is associated with the display of video images at the display device. For example, the timing diagram 600 illustrates a frame period that includes intervals 641-644, and a subsequent frame period that includes intervals 645-648. A frame period can correspond to the period of time that a single video frame (a single image) is displayed. For the present example, the frame period is determined by the frequency at which video frames are displayed. For example, a particular video stream may have a video frame rate of 30 frames per second, corresponding to a frame period of approximately 33 mS. Further, and again in regard to the present example, video information associated with a particular portion of the display is displayed concurrently with a corresponding PWM output interval. Thus, the intensity of a set of backlight LEDs associated with a portion of the display device is synchronized with the display of a corresponding portion of a video frame. For example, the duty ratio of the PWM signal PWM CH1 provided by the integrated circuit chip 520 (waveform 604), and corresponding to portion "1" of the LED panel 510 of FIG. 1, is updated substantially in unison with the display video information associated with portion "1." In other words, timing of the chip select signal can be synchronized to a video frame synchronization event, such as the beginning of a new frame of a video image.

Display of each portion of the frame, and the associated backlighting, is maintained for a period substantially equal to the frame period. For example, during intervals 641-644, video information associated with portions 1, 5, and 9 is displayed while corresponding back-light LEDs are illuminated based on the PWM outputs 660, 664, and 668, respectively. Similarly, during the intervals 642-645, video information associated with the portions 2, 6, and 10 is displayed while corresponding backlight LEDs are illuminated based on the PWM outputs 661, 665, and 669, respectively. Video information associated with the portions 3, 7, and 11 is displayed while corresponding backlight LEDs are illuminated based on the PWM outputs 662, 666, and 670, respectively. Finally, video information associated with the portions 4, 8, and 12 is displayed while corresponding backlight LEDs are illuminated based on the PWM outputs 663, 667, and 671, respectively. Thus, portions of a single frame of video information are displayed in a sequential manner over period extending from the interval 641 to the interval 647. Display of a subsequent frame of video information is similarly staggered, beginning at the interval 645, and accompanied by backlight illumination provided by the PWM output intervals 672, 676, and 680, respectively. One skilled in the art will appreciate that the particular apportionment of the LED panel 510 illustrated at FIG. 5 is only one example of how a display device and associated PWM signals can be partitioned. Furthermore, a greater or a fewer number of portions and PWM signals can be implemented without departing from the scope of the present disclosure.

During operation, it can be desirable to minimize the duration of the intervals 641, 642, and 643 to minimize intra-frame interference wherein a viewer of the display device may perceive undesired light diffusing from one portion of the display into another portion. For example, the duration of the intervals 641, 642, and 643 represents an inter-PWM signal delay, and can be reduced while increasing the duration of the interval 644 so that the total duration of the combined four intervals is equal to the frame period. A desired duration of the intervals 341, 342, and 343 can be determined based on the capabilities of the power supply to respond to dynamic changes in the duty ratio of the generated PWM signals, referred to herein as the Power Supply Recovery Delay. For example, a particular power supply may require five milliseconds to recover following a large increase in the duty ratio of a particular PWM signal. If another PWM signal were to make a similar transition in duty ratio before the power supply recovers, a user of the display device may witness a visible artifact such as momentary dimming of a portion of the display caused by a momentary reduction in the output voltage supplied by the power supply. Therefore, configuring each interval to have a duration in excess of five milliseconds can reduce the occurrence of such visual artifacts due to the limitations of the power supply.

Figure 7:
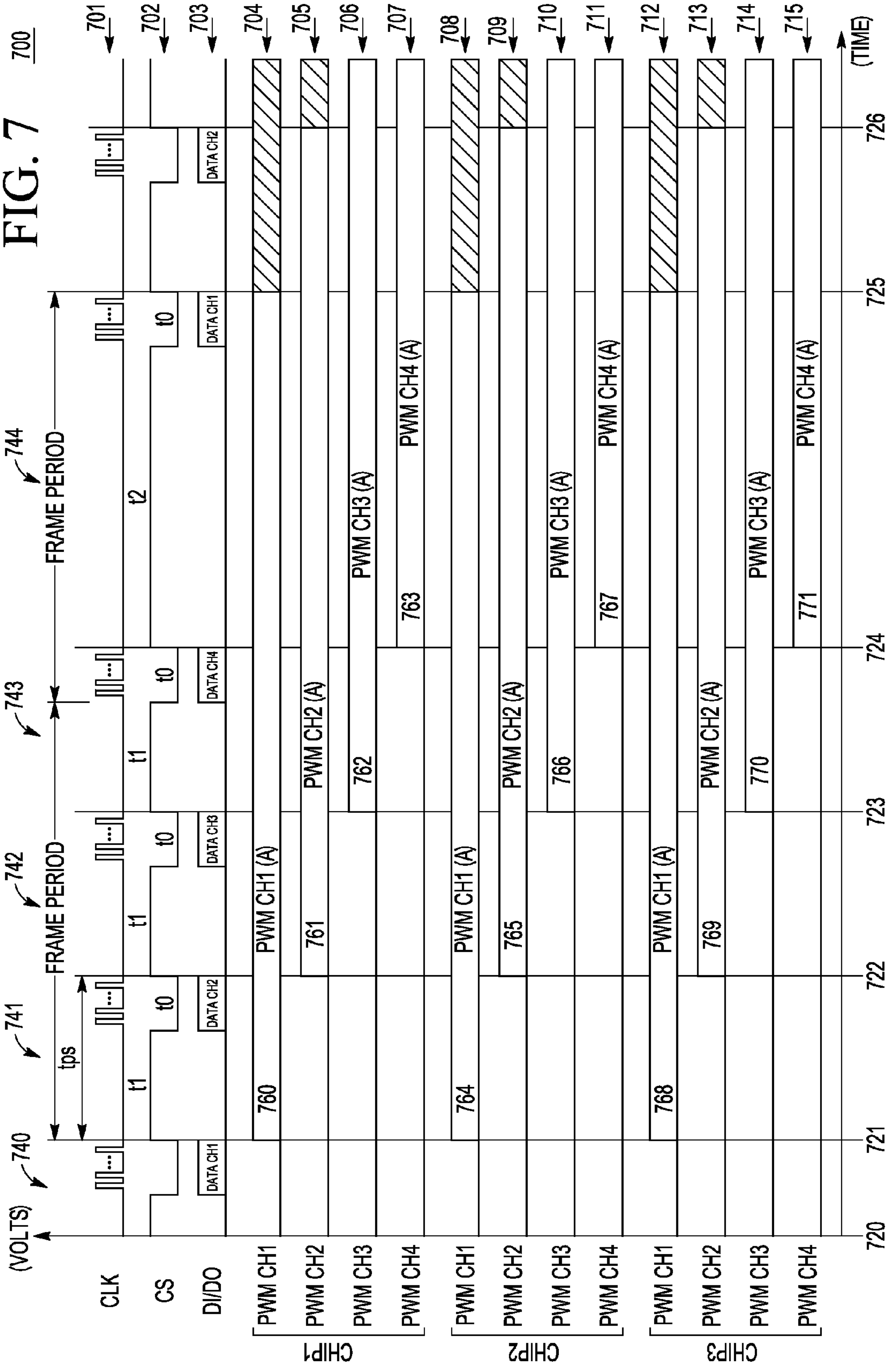
FIG. 7 depicts a timing diagram illustrating the operation of the PWM signal generator of FIG. 5 in accordance with another embodiment of the present disclosure

FIG. 7 depicts a timing diagram 700 illustrating the operation of the PWM signal generator 500 of FIG. 5 in accordance with another embodiment of the present disclosure. The timing diagram 700 is similar to the timing diagram 600, differing only with regard to the duration of the inter-PWM delay between channels CH1-CH4. In particular, the duration of the inter-PWM delays expand into two frame periods. Therefore $t_1+t_0=t_p$ is larger in FIG. 7 compared to that in FIG. 6. This facilitates increasing the delay introduced between successive PWM outputs ($t_{sp}$) beyond an amount that can be supported during a single frame period.

The timing diagram 700 depicts the video controller 502 sending and storing timing information at the PWM modules 504, 505, and 506 via an SPI interface, and the subsequent generation of the PWM signals PWM CH1, PWM CH2, PWM CH3, and PWM CH4 by each of integrated circuit chips 520, 521, and 522, respectively, based on the timing information and based on logic transitions of the chip select signal CS. The timing diagram 700 includes a horizontal axis representing time, a vertical axis representing voltage, and includes signal waveforms CLK 701, CS 702, DI/DO 703, PWM CH1 704, PWM CH2 705, PWM CH3 706, and PWM CH4 707 corresponding to integrated circuit chip 520, PWM CH1 708, PWM CH2 709, PWM CH3 710, and PWM CH4 711 corresponding to integrated circuit chip 521, and PWM CH1 712, PWM CH2 713, PWM CH3 714, and PWM CH4 715 corresponding to integrated circuit chip 522. Also illustrated at the timing diagram 700 are time references 720-726, intervals 740-744, and PWM output intervals 760-771.

The timing diagram 700 illustrates how a PWM signal generator, such as the PWM signal generator 100 of FIG. 1 and the PWM signal generator 500 of FIG. 5 can be used to provide multiple PWM signals, wherein the initiation of each respective PWM signal can be delayed based on a transition of a chip select signal. As illustrated at the timing diagram 700, the inter-PWM delay introduced by the PWM signal generator is not limited by the duration of a frame period or by any other factor. While the timing diagram 700 illustrates individual PWM output intervals, such as PWM output intervals 760-771 having a duration large enough such that all the inter-PWM delays cannot be finished in one frame period.

In an embodiment of the present disclosure, the amount of time that the chip select signal remains at a logic high state, such as period t1 at FIG. 7, between when the chip select signal is enabled and data can be sent to particular channels, can be varied dynamically on a frame-by-frame basis based on the image content of a corresponding video frame in order to ensure a power supply has sufficient time to respond to the change of video content between adjacent video frame and a desired phase shift between PWM signals. For example, the duty ratio to be implemented at a particular PWM channel during a particular PWM frame can be based upon the image to be displayed during that particular frame. Therefore, a significant change of image content between adjacent video frames can result in a large change of duty ratio that requires a power supply to adjust to a large load difference. To accommodate the power supply's limitation and intra-frame interference caused by inter-PWM delay, the offset (inter-PWM delay) between when PWM modules having a desired duty ratio are initiated, can be implemented by a delay amount stored at the timer TIMER1 111 and timer TIMER0 110 of FIG. 1 during interval 741, which can be increased or decreased relative to a previous frame based on the duty ratio configured for the PWM output interval 760 relative to the duty ratio configured for the same PWM output signal during the previous PWM output interval. Thus, a power supply providing current to an associated set of LEDs can be given additional time to recover (a corresponding increase in the duration of time tsp) when current demand increases dynamically due to a large increase in duty ratio of a corresponding PWM signal.

As illustrated in FIG. 7, the amount of time between adjacent PWM signals being initialized is greater than the duration of a frame period divided by the number of PWM channels less one (Frame period/(# of PWM channels−1)). This results in at least the last PWM channel of the module being initialized after a delay equal to at least one frame period from when an initial channel was initiated. Therefore, the duration from when PWM CH1 is initialized at FIG. 7, time 721, and when PWM CH4 is initialized at FIG. 7, time 724, is greater than the duration of the video frame, i.e., the frame period. In another embodiment, not illustrated, when there is no need for the power supply to have additional recovery time, an offset between the initiation of PWM channels can be implemented determined by the minimum amount of data that needs to be transmitted during time t0.

Figure 8:
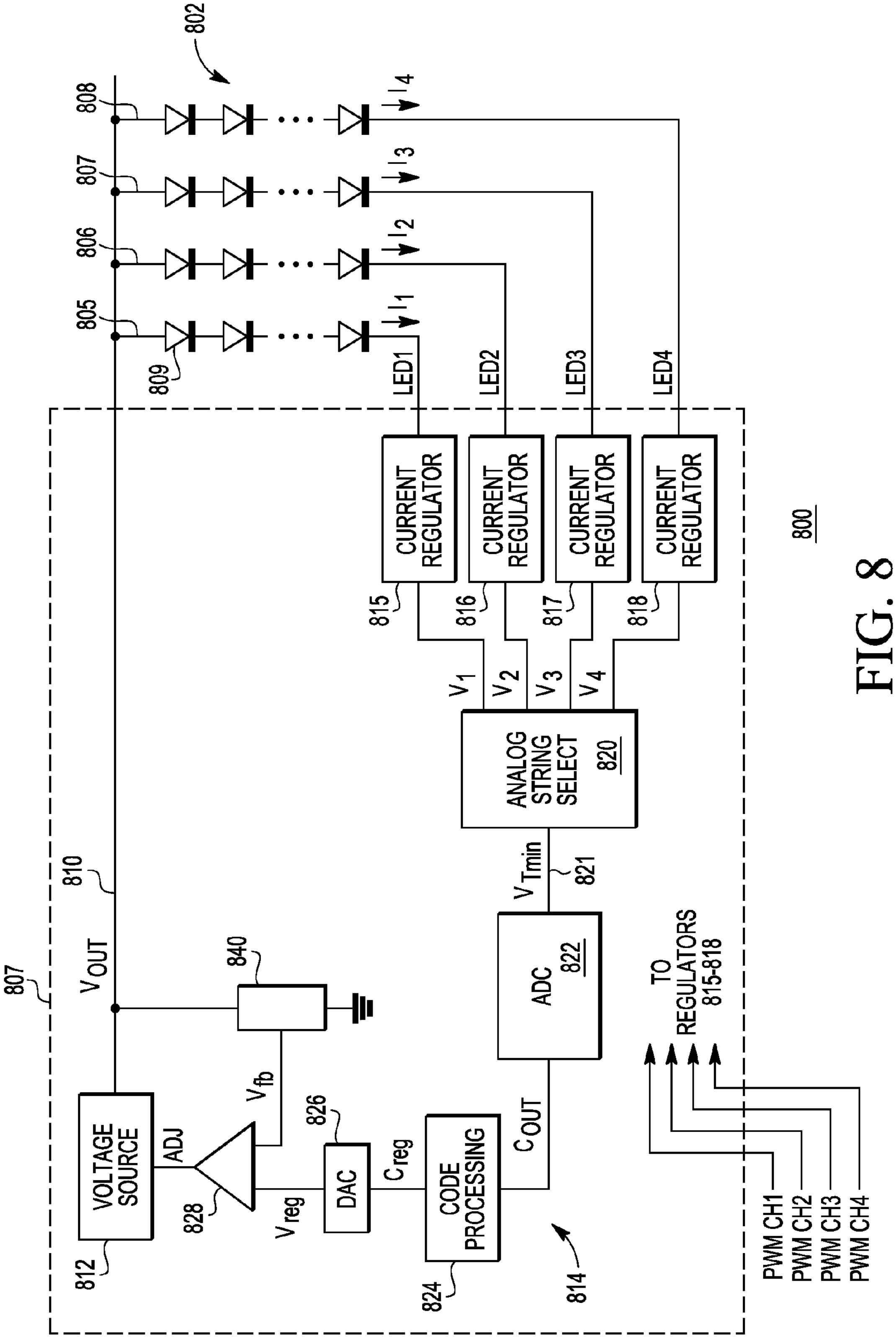
FIG. 8 is a diagram illustrating an example light emitting diode (LED) system implementing the PWM signal generator of FIG. 1 in accordance with at least one embodiment of the present invention.

FIG. 8 illustrates a specific embodiment of a portion of an LED system 800 that includes an LED driver 807 coupled to a LED panel 802. LED driver represents a specific embodiment of a driver that can be implemented at each of the drivers 507-509 of FIG. 5*for* dynamic power management in a LED system 800. In a particular embodiment, the LED strings 805-808 of LED panel 802 correspond to portions 1-4, respectively, of the LED panel 510 of FIG. 5 The term "LED string," as used herein, refers to a grouping of one or more LEDs connected in series. The "head end" of a LED string is the end or portion of the LED string which receives the driving voltage/current and the "tail end" of the LED string is the opposite end or portion of the LED string. The term "tail voltage," as used herein, refers the voltage at the tail end of a LED string or representation thereof (e.g., a voltage-divided representation, an amplified representation, etc.). The term "subset of LED strings" refers to one or more LED strings.

Each of the LED strings 805-808 include one or more LEDs 809 connected in series. The LEDs 809 can include, for example, white LEDs, red, green, blue (RGB) LEDs, organic LEDs (OLEDs), etc. Each LED string is driven by the adjustable voltage VOUT received at the head end of the LED string from a voltage source 812 of the LED driver 807 (not shown in previous figures) via a voltage bus 810 (e.g., a conductive trace, wire, etc.). In the embodiment of FIG. 8, the voltage source 812 is implemented as a DC/DC converter configured to drive the output voltage VOUT using a supplied input voltage.

The LED driver 807 includes a feedback controller 814 configured to control the voltage source 812 based on the tail voltages at the tail ends of the LED strings 805-808. The feedback controller 814, in one embodiment, includes a plurality of current regulators (e.g., current regulators 815, 816, 817, and 818), an analog string select module 820, an ADC 822, a code processing module 824, a control digital-to-analog converter (DAC) 826, and an error amplifier 828.

The current regulator 815 is configured to maintain the current $I_1$ flowing through the LED string 805 at or near a fixed current (e.g., 90 mA) when active. Likewise, the current regulators 816, 817, and 818 are configured to maintain the currents $I_2$, $I_3$, and $I_4$ flowing through the LED strings 806, 807, and 808, respectively, at or near the fixed current when active.

A current regulator typically operates more effectively when the input of the current regulator is a non-zero voltage so as to accommodate the variation in the input voltage that often results from the current regulation process of the current regulator. This buffering voltage often is referred to as the "headroom" of the current regulator. As the current regulators 815-818 are connected to the tail ends of the LED strings 805-808, respectively, the tail voltages of the LED strings 805-808 represent the amounts of headroom available at the corresponding current regulators 815-818. However, headroom in excess of that necessary for current regulation purposes results in unnecessary power consumption by the current regulator.

PWM signals, such as signals PWM CH1, PWM CH2, PWM CH3, and PWM CH4 of FIG. 1, are generated in a manner described above, and received at the LED driver 807 and provided to current regulators 815-818, respectively, to control the activation of the corresponding LED strings. Likewise, as the PWM signals are delayed and phase shifted relative to each other, the potential for ripple and voltage-droop in the voltage $V_{OUT}$ provided by the voltage source 812 can be reduced, as can audible noise and visual flickering that could otherwise occur if all of the LED strings were to be activated and deactivated simultaneously.

The analog string select module 820 includes a plurality of tail inputs coupled to the tail ends of the LED strings 805-808 to receive the tail voltages $V_{T1}$, $V_{T2}$, $V_{T3}$, and $V_{T4}$ of the LED strings 805-808, respectively, and an output to provide an analog signal 821 representative of the minimum tail voltage $V_{Tmin}$ of the LED strings 805-808 at any given point over a detection period. In one embodiment, the analog string select module 820 is implemented as a diode-OR circuit having a plurality of inputs connected to the tail ends of the LED strings 805-808 and an output to provide the analog signal 821.

The ADC 822 is configured to generate one or more digital code values $C_{OUT}$ representative of the voltage of the analog signal 821 at one or more corresponding sample points. The code processing module 824 includes an input to receive the one or more code values $C_{OUT}$ and an output to provide a code value $C_{reg}$ based on the minimum value of the received code values $C_{OUT}$ for a given detection period or a previous value for $C_{reg}$ from a previous detection period. As the code value $C_{OUT}$ represents the minimum tail voltage that occurred during the detection period (e.g., a PWM cycle, a display frame period, etc.) for all of the LED strings 805-808, the code processing module 824, in one embodiment, compares the code value $C_{OUT}$ to a threshold code value, $C_{thresh}$, and generates a code value $C_{reg}$ based on the comparison. The code processing module 824 can be implemented as hardware, software executed by one or more processors, or a combination thereof. To illustrate, the code processing module 824 can be implemented as a logic-based hardware state machine, software executed by a processor, and the like.

The control DAC 826 includes an input to receive the code value $C_{reg}$ and an output to provide a regulation voltage $V_{reg}$ representative of the code value $C_{reg}$. The regulation voltage $V_{reg}$ is provided to the error amplifier 828. The error amplifier 828 also receives a feedback voltage $V_{fb}$ representative of the output voltage $V_{OUT}$. In the illustrated embodiment, a voltage divider 840 is used to generate the voltage $V_{fb}$ from the output voltage $V_{OUT}$. The error amplifier 828 compares the voltage $V_{fb}$ and the voltage $V_{reg}$ and configures a signal ADJ based on this comparison. The voltage source 812 receives the signal ADJ and adjusts the output voltage $V_{OUT}$ based on the magnitude of the signal ADJ.

There may be considerable variation between the voltage drops across each of the LED strings 805-808 in the LED system 800 due to static variations in forward-voltage biases of the LEDs 809 of each LED string and dynamic variations due to the on/off cycling of the LEDs 809. Thus, there may be significant variance in the bias voltages needed to properly operate the LED strings 805-808. However, rather than drive a fixed output voltage $V_{OUT}$ that is substantially higher than what is needed for the smallest voltage drop as this is handled in conventional LED drivers, the LED driver 807 illustrated in FIG. 8 utilizes a feedback mechanism that permits the output voltage $V_{OUT}$ to be adjusted so as to reduce or minimize the power consumption of the LED driver 804 in the presence of variances in voltage drop across the LED strings 805-808. Further, by delaying the output PWM signals used to drive the LED strings 805-808, the LED drivers of a system can experience less voltage ripple at the output voltage $V_{OUT}$, as well as reduce or eliminate audible and visual noise. Moreover, the LED system 800 can avoid beating and other visual noise artifacts that otherwise would result from a lack of synchronization between the output PWM signals and the frame rate of the video displayed via the LED system 800.

In a first aspect, a method can include receiving first information at a first pulse width modulation (PWM) module responsive to a chip select signal being asserted at a chip select input of a communication bus of the first PWM module during a first time. The method can also include providing a first PWM signal at a first output of the first PWM module beginning a predetermined amount of time after the first logic transition of the chip select signal, the first PWM signal generated by the first PWM module based upon the first information.

In one embodiment of the first aspect, the method further includes latching the first information at a control register of the first PWM module in response to the first logic transition of the chip select signal. In another embodiment of the first aspect, the method further includes receiving second information at the first pulse width modulation (PWM) module in response to the chip select signal being asserted at the chip select input of the communication bus of the first PWM module during a second time. The method still further includes providing a second PWM signal at a second output of the first PWM module beginning the predetermined amount of time after the second logic transition of the chip select signal, the second PWM signal generated by the first PWM module based upon the second information.

In another embodiment, the method includes latching the first information at a control register of the first PWM module in response to the first logic transition of the chip select signal, and latching the second information at a control register of the first PWM module in response to a second logic transition of the chip select signal. In a particular embodiment, the first and second PWM signals control a brightness of a display device. In a more particular embodiment, the first PWM signal is provided to control a brightness of a first portion of a display device, and the second PWM signal is provided to control a brightness of a second portion of a display device. In an even more particular embodiment, the first PWM signal has a duty ratio indicated by the first information and the second PWM signal has a duty ratio indicated by the second information.

In another embodiment of the first aspect, the duty ratio of the first PWM signal and the duty ratio of the second PWM signal are based upon a video content of a first video frame. In a particular embodiment, a duration between the first and second logic transitions of the chip select signal is based upon the video content of the first video frame. In a more particular embodiment, the duration between the first and second logic transitions of the chip select signal is further based upon a comparison of the video content of the first video frame and a video content of a second video frame. In an even more particular embodiment, the duration between the first and second logic transitions of the chip select signal is greater than the duration of an initial PWM cycle of the first PWM signal.

In another particular embodiment of the first aspect, the duration between the first and second logic transitions of the chip select signal is greater than the duration of the first video frame. In still another particular embodiment, a total of N PWM signals is provided to a display device, where N is an integer, each of the N PWM signals having respective duty ratios based upon the first frame, the N PWM signals including the first PWM signal and the second PWM signal, and an initial logic transition of each of the N PWM signals occurring during a duration defined by an initial PWM cycle of the first PWM signal. In a further embodiment, a total of N PWM signals is provided to a display device, where N is an integer, each of the N PWM signals having respective duty ratios based upon the first frame, the N PWM signals including the first PWM signal and the second PWM signal, and a duration between when the first PWM signal is initialized to implement the first duty ratio and the second PWM signal is initialized to implement the second duty ration is greater than the duration of the first video frame divided by (N−1).

In a further embodiment of the first aspect, based upon the first and second information, the first and second PWM signal have the same duty ratio. In a particular embodiment, based upon the first and second information the first and second PWM signal have different duty ratios.

In another embodiment of the first aspect, the method includes receiving, during a second time, the first information at a second PWM module in response to the chip select signal being asserted at the chip select input of the communication bus, wherein the second time is prior to the first time and receiving the first information includes receiving the first information from the second PWM module during the first time in response to the second PWM module receiving the second information at the first pulse PWM. The method also includes latching the second information at a control register of the first PWM module in response to the first logic transition of the chip select signal, and providing a second PWM signal at a first output of the first PWM module beginning the predetermined amount of time after the second logic transition of the chip select signal, the second PWM signal generated by the second PWM module based upon the second information.

In a second aspect, a method can include determining an offset between when a first Pulse Width Module (PWM) signal having a first duty ratio is to be initiated at a first PWM output and when a second PWM signal having a second duty ratio is to be initiated at a second PWM output, the first and second PWM signals to control a brightness of a display device, and providing a first transition and a second transition of a chip select signal to a chip select interconnect of a communication bus, a duration between the first transition and the second transition being substantially equal to the offset, wherein communication of digital information between the first and second device via a data interconnect of the communication bus is enabled in response to the chip select signal being asserted.

In one embodiment of the second aspect, the method further includes determining the offset includes determining the offset based upon an expected difference in power supply loading due to a change in video information between video frames. In another embodiment, determining the offset further includes determining the offset based upon a desired phase shift between transitions PWM signals that are to occur during a time defined by a PWM cycle.

In a third aspect, a device can include a communication bus comprising a data interconnect and a chip select interconnect, and a controller comprising a communication bus interface coupled to the communication bus. A PWM module can include a communication bus interface coupled to the communication bus, and a first PWM output, the PWM module to be enabled to receive a information via the data interconnect of the communication bus in response to a chip select signal being asserted at the chip select node, and the PWM module to store the information at a first control register in response to a first logic transition of the chip select signal, and the PWM module to provide a first PWM signal to the PWM output a predetermined amount of time after the first logic transition of the chip select signal, the first PWM signal having a duty ratio based upon information received via the data node, and a PWM-driven component can also include a first input coupled to the first PWM output.

In one embodiment of the third aspect, the PWM driven component is a display device. In a particular embodiment, the controller is a video controller to determine a duration between the first logic transition and a second logic transition of the chip select signal to be provided to the chip select node, the duration based upon a comparison of a first frame of video information to a second frame of video information, and the PWM module to store a second information at a second control register in response to the second logic transition of the chip select signal, and the PWM module to provide a second PWM signal based on the second information to a second PWM output the predetermined amount of time after the second logic transition of the chip select signal. In a more particular embodiment, the PWM module is a first PWM module, and further includes a second PWM module comprising a communication bus interface coupled to the communication bus, a data output coupled to a data input of the first PWM and a second PWM output, the second PWM module to be enabled to receive the first information and a second information via the data interconnect of the communication bus in response to a chip select signal being asserted at the chip select node, and the second PWM module to provide the first information to the first PWM module in response to receiving the second information, and to store the second information upon the first logic transition of the chip select signal, and the second PWM module to provide a second PWM signal to the second PWM output the predetermined amount of time after the first logic transition of the chip select signal, the second PWM signal having a first duty ratio based upon second information received via the data node. The PWM driven component further includes a second input coupled to the second PWM output.

What is claimed is:

1. A method comprising:

receiving first information at a first pulse width modulation (PWM) module responsive to a chip select signal being asserted at a chip select input of a communication bus of the first PWM module during a first time; and providing a first PWM signal at a first output of the first PWM module beginning a predetermined amount of time after a first logic transition of the chip select signal, the first PWM signal generated by the first PWM module based upon the first information.

2. The method of claim 1, further comprising:

latching the first information at a control register of the first PWM module in response to the first logic transition of the chip select signal.

3. The method of claim 1 further comprising:

receiving second information at the first PWM module in response to the chip select signal being asserted at the chip select input of the communication bus of the first PWM module during a second time; and providing a second PWM signal at a second output of the first PWM module beginning the predetermined amount of time after a second logic transition of the chip select signal, the second PWM signal generated by the first PWM module based upon the second information.

4. The method of claim 3 further comprising:

latching the first information at a control register of the first PWM module in response to the first logic transition of the chip select signal; and latching the second information at the control register of the first PWM module in response to the second logic transition of the chip select signal.

5. The method of claim 3 wherein the first and second PWM signals control a brightness of a display device.

6. The method of claim 3 wherein the first PWM signal is provided to control a brightness of a first portion of a display device, and the second PWM signal is provided to control a brightness of a second portion of the display device.

7. The method of claim 3, wherein the first PWM signal has a duty ratio indicated by the first information and the second PWM signal has a duty ratio indicated by the second information.

8. The method of claim 7, wherein the duty ratio of the first PWM signal and the duty ratio of the second PWM signal are based upon a video content of a first video frame.

9. The method of claim 8, wherein a duration between the first and second logic transitions of the chip select signal is based upon the video content of the first video frame.

10. The method of claim 9, wherein the duration between the first and second logic transitions of the chip select signal is further based upon a comparison of the video content of the first video frame and a video content of a second video frame.

11. The method of claim 9, wherein the duration between the first and second logic transitions of the chip select signal is greater than the duration of an initial PWM cycle of the first PWM signal.

12. The method of claim 9, wherein the duration between the first and second logic transitions of the chip select signal is greater than the duration of the first video frame.

13. The method of claim 8, wherein a total of N PWM signals is provided to a display device, where N is an integer, each of the N PWM signals having respective duty ratios based upon the first video frame, the N PWM signals including the first PWM signal and the second PWM signal, and an initial logic transition of each of the N PWM signals occurring during a duration defined by an initial PWM cycle of the first PWM signal.

14. The method of claim 8, wherein a total of N PWM signals is provided to a display device, where N is an integer, each of the N PWM signals having respective duty ratios based upon the first video frame, the N PWM signals including the first PWM signal and the second PWM signal, and a duration between when the first PWM signal is initialized to implement the first duty ratio and the second PWM signal is initialized to implement the second duty ration is greater than the duration of the first video frame divided by (N−1).

15. The method of claim 3 further comprising:

receiving, during a second time, the first information at a second PWM module in response to the chip select signal being asserted at the chip select input of the communication bus, wherein the second time is prior to the first time;

wherein receiving the first information includes receiving the first information from the second PWM module during the first time in response to the second PWM module receiving the second information at the first pulse PWM;

latching the second information at a control register of the first PWM module in response to the first logic transition of the chip select signal;

providing a second PWM signal at a first output of the first PWM module beginning the predetermined amount of time after the second logic transition of the chip select signal, the second PWM signal generated by the second PWM module based upon the second information.

16. A method comprising:

determining an offset between when a first Pulse Width Modulation (PWM) signal having a first duty ratio is to be initiated at a first PWM output of a first PWM module and when a second PWM signal having a second duty ratio is to be initiated at a second PWM output of the first PWM module, the first and second PWM signals to control a brightness of a display device; and providing a first transition and a second transition of a chip select signal to a chip select interconnect of a communication bus, a duration between the first transition and the second transition being substantially equal to the offset, wherein communication of digital information between a controller and the first PWM module via a data interconnect of the communication bus is enabled in response to the chip select signal being asserted.

17. The method of claim 16, wherein determining the offset includes determining the offset based upon an expected difference in power supply loading due to a change in video information between video frames.

18. The method of claim 17, wherein determining the offset further includes determining the offset based upon a desired phase shift between transitions of PWM signals that are to occur during a time defined by a PWM cycle.

19. A device comprising:

a communication bus comprising a data interconnect and a chip select interconnect;

a controller comprising a communication bus interface coupled to the communication bus;

a PWM module comprising a communication bus interface coupled to the communication bus, and a first PWM output, the PWM module to be enabled to receive information via the data interconnect of the communication bus in response to a chip select signal being asserted at the chip select interconnect, and the PWM module to store the information at a first control register in response to a first logic transition of the chip select signal, and the PWM module to provide a first PWM signal to the PWM output a predetermined amount of time after the first logic transition of the chip select signal, the first PWM signal having a duty ratio based upon information received via the chip select interconnect; and a PWM-driven component comprising a first input coupled to the first PWM output.

20. The device of claim 19, wherein the controller is a video controller to determine a duration between the first logic transition and a second logic transition of the chip select signal to be provided to the chip select interconnect, the duration based upon a comparison of a first frame of video information to a second frame of video information, and the PWM module to store second information at a second control register in response to the second logic transition of the chip select signal, and the PWM module to provide a second PWM signal based on the second information to a second PWM output the predetermined amount of time after the second logic transition of the chip select signal.

* * * * *